United States Patent [19]
Goldberg et al.

[11] Patent Number: 5,503,698
[45] Date of Patent: Apr. 2, 1996

[54] BONDING METHOD EMPLOYING ORGANOMETALLIC INTERCONNECTORS

[75] Inventors: Martin J. Goldberg, Mahopac, N.Y.; Hiroshi Ito, San Jose, Calif.; Caroline A. Kovac, Ridgefield, Conn.; Michael J. Palmer, Walden, N.Y.; Roger A. Pollak, Pleasantville, N.Y.; Paige A. Poore, Durham, N.C.

[73] Assignee: International Business Machines Corporation, Armonk, N.Y.

[21] Appl. No.: 727,099

[22] Filed: Jul. 9, 1991

Related U.S. Application Data

[62] Division of Ser. No. 538,288, Jun. 14, 1990, abandoned.
[51] Int. Cl.$^6$ ........................................ B32B 31/00
[52] U.S. Cl. ................. 156/155; 106/1.26; 106/1.28; 156/281; 156/325; 156/327; 228/198; 437/209; 524/176; 524/403
[58] Field of Search ....................... 156/155, 325, 156/281, 327; 228/198; 524/176, 403; 106/1.26, 1.28; 437/209

[56] References Cited

U.S. PATENT DOCUMENTS

| | | |
|---|---|---|
| 2,566,339 | 9/1951 | Klinker . |
| 2,945,295 | 7/1960 | Feaster ................................ 228/198 |
| 3,069,765 | 12/1962 | Simpelaar . |
| 4,102,192 | 7/1978 | Smith et al. .......................... 524/176 |
| 4,574,095 | 3/1986 | Baum et al. . |
| 4,701,351 | 10/1987 | Jackson . |
| 4,734,481 | 3/1988 | Steinmann . |

OTHER PUBLICATIONS

Auerbach, "Method for Reducing Metal Salts Complexed in a Polymer Host With a Laser", J. Electrochem. Soc.: Solid-State Science and Technology, Jun. 1985, vol. 132, No. 6, pp. 1437–1440.

Ohuchi et al. "Planar LSI Interconnection Method Utilizing Polymeric Conductor", IMC 1986 Proceedings, Kobe, May 28–30, 1986, pp. 127–131.

Auerbach, "A New Scheme for Device Packaging", IEEE Transactions on Components, Hybrids, and Manufacturing Technology, vol. CHMT–8, No. 3, Sep. 1985, pp. 309–312.

Hsu et al., "The Wire Bondability of Thick Film Gold, Sputtered Thin Film Gold and Metallo–Organic Thin Film Gold, Proceedings", 1985 International Symposium on Microelectronics, Int. Soc. Hybrid Microelectronics, Anaheim, CA, 11–15 Nov. 1985, pp. 428–434.

Needes et al., "Thick Film Materials For Copper Hybrid Circuits", IMC 1986 Proceedings, Kobe, May 28–30, 1986, pp. 239–248.

Houle et al., "Laser Chemical Vapor Deposition of Copper", Appl. Phys. Letter, vol. 46, No. 2, 15 Jan. 1985, pp. 204–206.

Baum et al., "Laser Chemical Vapor Deposition of Gold", Appl. Phys. Letter, vol. 47, No. 5, 1 Sep. 1985, pp. 538–540.

*Primary Examiner*—John J. Gallagher
*Attorney, Agent, or Firm*—Perman & Green

[57] ABSTRACT

A chemical solder is described that includes an organometallic complex or compound which thermally degrades within a predetermined temperature range to a metal and volatile compounds. The solder also includes a polymeric matrix that decomposes within the same temperature range to volatile fractions, thereby leaving only the metal. A method for bonding first and second bodies is disclosed wherein a chemical solder, as above-described, is disposed between the first and second bodies and heat is applied to elevate the solder to the predetermined temperature range to thermally degrade the organometallic compound and to decompose the polymeric matrix. The remaining metal bonds the first and second bodies.

5 Claims, 1 Drawing Sheet

BONDING METHOD EMPLOYING ORGANOMETALLIC INTERCONNECTORS

This is a divisional of copending application Ser. No. 07/538,288 filed on Jun. 14, 1990, now abandoned.

FIELD OF THE INVENTION

This invention relates to organometallic polymers, and more particularly to certain organometallic polymers which lend themselves to the creation of solder-like bonds between metallic bodies.

BACKGROUND OF THE INVENTION

Presently, technologies for connecting semiconductor chips to underlying conductor arrays include thermo-compression and solder-based bonding. Thermo-compression bonding is a low cost process and is used for many low-to-mid performance chip applications. It requires the application of significant pressure to form the chip/conductor interconnection and may, at times, damage underlying active chip structures. Generally, this bonding method is not usable with chips which have active circuitry beneath the bonding pads. Its use with chips having perimeter I/O and area I/O interconnections significantly reduces the area of silicon available to accommodate circuitry and bonding pads and increases the chip's cost. Solder-based technologies have been used to interconnect to such chip structures, as they provide low stress bonding methods and enable circuitry to be located under the bonding pads. However, solder-based technologies are relatively expensive and typically have been limited to high-end packaging applications.

Efforts have been expended to establish chip connection by writing connector lines using thick film pastes similar to those used in hybrid-circuit technology. These pastes are typically suspensions of 40%–80% metal flakes in a polymer, which polymer is cured (i.e., not volatilized) to form metallic lines. While it is preferred to produce metallic lines whose resistivity approaches that of the pure metal, because some of the paste remains in the metallic lines, substantially higher resistivities are found.

Another prior art technique for providing conductive circuit lines employs chemical vapor deposition of a volatile organometallic complex on a substrate through the use of a laser to "write" lines on the substrate. Since this procedure is a direct "write" technique, it is throughput limited and does not lend itself to high volume production. Circuit lines had also been written with lasers by reducing a complex in a thermoplastic polymer. In none of these cases is a direct bond formed. Each is employed to create circuit lines either by laser deposition or by fine line printing of thick film pastes. These efforts are covered in more detail in the following references:

A. Auerbach, "Method for Reducing Metal Salts Complexed in a Polymer Host with a Laser," J. Electro Chem. Soc., 132, 6, p. 1437, 1985.

M. Ohuchi et al., "Planar LSI Interconnection Method Utilizing Polymeric Conductor:, IMC 1986 Proceedings, Kobe, May 28–36, 1986.

Auerbach, "A New Scheme for Device Packaging", IEEE Transactions on Components, etc, "Vol CHMT-8, No. 3, Sep. 1985, pp. 309–312.

Hsu et al., "The Wire Bondability of Thick Film Gold, Sputtered Thin Film Gold and Metallo-Organic Thin Film Gold" Proceedings 1985 International Symposium on Microelectronics, Int. Soc. Hybrid Microelectronics, Anaheim, Cal., 11–15 Nov. 1985, pp. 428–434.

C. Needes et al., "Thick Film Materials for Copper Hybrid Circuits", IMC 1986 Proceedings, Kobe, May 28–30, 1986.

F. Houle, C. Jones, T. Baum, C. Pico, C. A. Kovac, "Laser Chemical Vapor Deposition of Copper", Appl. Phys. Lett., 46, p. 204, 1985.

T Baum and C Jones, "Laser Chemical Vapor Deposition of Gold", Appl. Phys. Lett. 47, p. 538, 1985.

Certain aspects of the above-noted deposition techniques present difficulties when applied to semiconductor applications. For instance, in order to drive off the pastes used to carry the metal flakes, high temperatures must be employed. These temperatures tend to damage and otherwise unfavorably affect circuit components, while still leaving the organic material incorporated in the final conductive lines.

It is known that certain organometallics reduce to a metal state at much lower temperatures than paste/polymer combinations (e.g. on the order of 100°–300° C. as contrasted to 800° C.–1500° C.). Organometallics have been used in the prior art to create metal seeding layers for subsequently applied conductor patterns. For instance, in U.S. Pat. No. 4,574,095 to Baum et al., a palladium organometallic compound is irradiated selectively by light, thereby depositing palladium seeds in the irradiated areas. Following the deposition of the palladium seeds, copper is deposited thereon.

In U.S. Pat. No. 4,701,351 to Jackson, a thin organometallic layer is applied as a coating and then may have an additional coating of a photoresist placed thereover. During subsequent processing, portions of the organometallic are reduced to the metal state, to provide a substrate upon which subsequent conductor deposition can occur.

In U.S. Pat. No. 4,734,481 to Steinmann, a class of organometallic polymers is described, particularly useful for photoactive coating agents for various types of substrates. The preferred organometallic polymer is an end-capped polyphthalaldehyde. These materials are employed similarly to other photosensitive photomicrography materials. In other words, they are applied as a layer, imaged in a conventional manner and the irradiated areas decomposed, with resultant monomers evaporating and exposing the underneath substrate. A benefit deriving from the use of these organometallics is that they convert to their volatile monomeric state at relatively low processing temperatures and leave little or no residue.

It is therefore an object of this invention to provide an interconnection technique which employs low temperatures and provides good metallurgical results.

It is another object of this invention to provide a low temperature interconnection technique which enables the generation of a homogenous metallic bonds.

It is a further object of this invention to provide a method of forming metal-metal bonds which are characterized by low stress, low temperature conditions.

SUMMARY OF THE INVENTION

A chemical solder is described that includes an organometallic complex or compound which thermally degrades within a predetermined temperature range to a metal and volatile compounds. The solder also includes a polymeric matrix that decomposes within the same temperature range to volatile fractions, thereby leaving only the metal.

A method for bonding first and second bodies is disclosed wherein a chemical solder, as above-described, is disposed between the first and second bodies and heat is applied to elevate the solder to the predetermined temperature range to thermally degrade the organometallic compound and to decompose the polymeric matrix. The remaining metal bonds the first and second bodies.

DETAILED DESCRIPTION OF THE INVENTION

Figure 1:
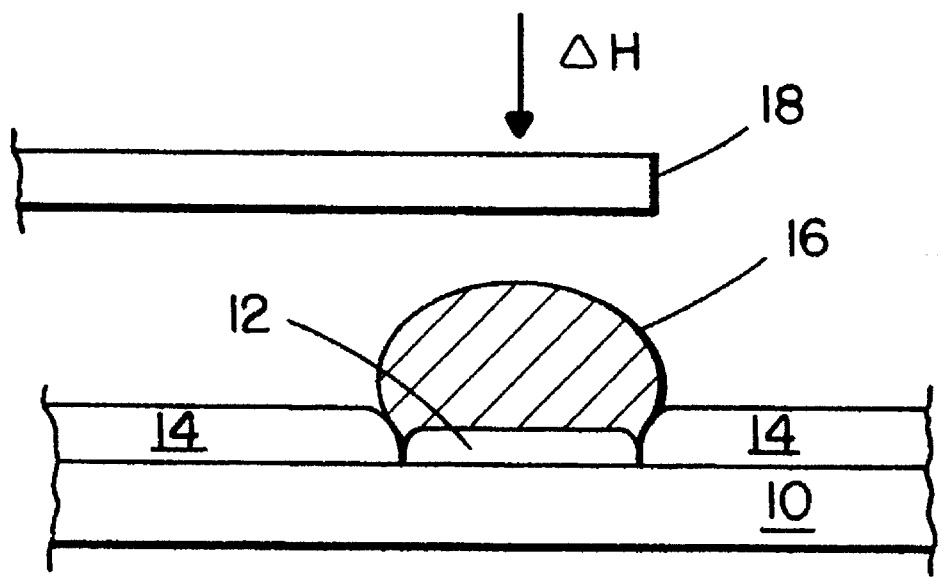
FIG. 1 is a sectional view of a semiconductor chip/lead assembly wherein a ball of chemical solder has been applied to a land area of the semi conductor chip.

A preferred embodiment of the chemical solder of this invention includes a selected organometallic complex which is blended with a solvent and a polymer into a paste. Suitable organometallic complexes are those that will thermally reduce to a pure metal along with volatile ligands. Examples of such complexes include: copper acetylacetonate, cupric acetate, palladium acetylacetonate, platinum acetylacetonate, and dimethyl gold acetylacetonate. Each of these organometallic complexes, when heated, reduces to the pure metal state along with volatile fractions. Each of those complexes completes the reduction phase in a temperature range which is less than approximately 325° C. Preferably, the organometallic complex should contain a metal selected from the class of gold, silver, tungsten, nickel, aluminum, copper, palladium, or platinum.

A suitable polymer for use with the chemical solder must have a high ionic purity and decompose at relatively low temperatures ( i.e., less than 325° C.) to volatile, non corrosive oligomers, or fragment into volatile fractions. The term decompose will, hereinafter, be used herein to include both the depolymerization and fragmentation reactions. The fact that such polymers decompose into non-corrosive, volatile components eliminates contaminating residues and the need for cleaning. It is to be understood that a small percentage of polymeric residue can be accommodated in the solder, however no more than 10% residue is acceptable. The level of residue can be determined by measuring the resistivity of the remaining metal after the application of heat. Essentially, it is most desirable to obtain resistivities as close as possible to the bulk metal.

The preferred polymer for use with the chemical solder is polyphthalaldehyde. Other polymers which are acceptable are:

Poly (isopropenyl ketones) e.g., poly (isopropenyl t-butyl ketone;

Poly (alpha-methyl styrenes), e.g., poly (p-hydroxy-alpha-methyl styrene);

Poly (t-butyl carbonates);

Poly (alkene oxides);

Poly (alkene sulfides); e.g., poly (styrene oxide), poly (styrene sulfide);

Alternating copolymers of phthalic anhydride with epoxides; or

Poly (methacrylates), e.g. poly (methyl methacrylate), poly (benzyl methacrylate)

Suitable solvents for use with the chemical solder of this invention include:

Polar protic solvents, e.g., Dimethyl formamide, N,N-Dimethyl acetamide, N-methyl-2-pyrrolidinone;

Aromatic hydrocarbons, e.g., Toluene, Xylene; or

Glyme;

Diglyme;

Gamma-butyrolactone;

(±) Propylene carbonate;

Propylene glycol methyl ether acetate;

Methyl ethyl ketone;

methyl iso-butyl ketone.

Polymers usable with this invention each exhibit a polymerization/depolymerization reaction which is reversible. As heat is applied, the reaction equilibrium shifts towards the monomer state, with the monomer being volatile at the elevated temperature. In some cases, the depolymerization reaction is not back to the monomer state, but results in the polymer decomposing into oligomeric fractions which are, in themselves volatile. It is important in each case, that the result of the heating phase lead to a volatile compound or fraction which is driven off at the elevated temperature. It has been observed with polyphthalaldehyde that its decomposition commences at approximately 130° C., and at 190° C. little or none is left.

As regards the organometallic reaction, at the elevated temperature the organometallic reacts to give zero valence metal with the organic portion volatilizing. The remaining metal forms clusters and finally agglomerates to form a continuous metal deposit. It has been noted with dimethyl gold acetylacetonate, that the decomposition of the organometallic commences at between 130° to 150° C. and is complete at between 200° C.–300° C.

Reductive decomposition of the organometallic complex to the zero valent metal may be further facilitated by exposure of the complex to a reducing gas during heating. This can be accomplished through the use of a bonding thermode which provides a uniform gas flow about the complex during heating. A reducing or forming gas of from 3% to 10% $H_2$ in $N_2$ is preferred.

Referring now to FIG. 1, there is shown a semiconductor chip 10 which is provided with a conductive land area 12 that is, in turn, surrounded by a passivation layer 14. A deposit of chemical solder 16 is emplaced on land area 12 and a conductive lead 18 has both heat and a modest amount of pressure applied, causing it to come into contact with chemical solder deposit 16. As the entire combination is brought up in temperature, the polymeric components within chemical solder 16 decompose, volatilize, and leave a metal deposit which bonds conductor 18 to land area 12.

Figure 2:
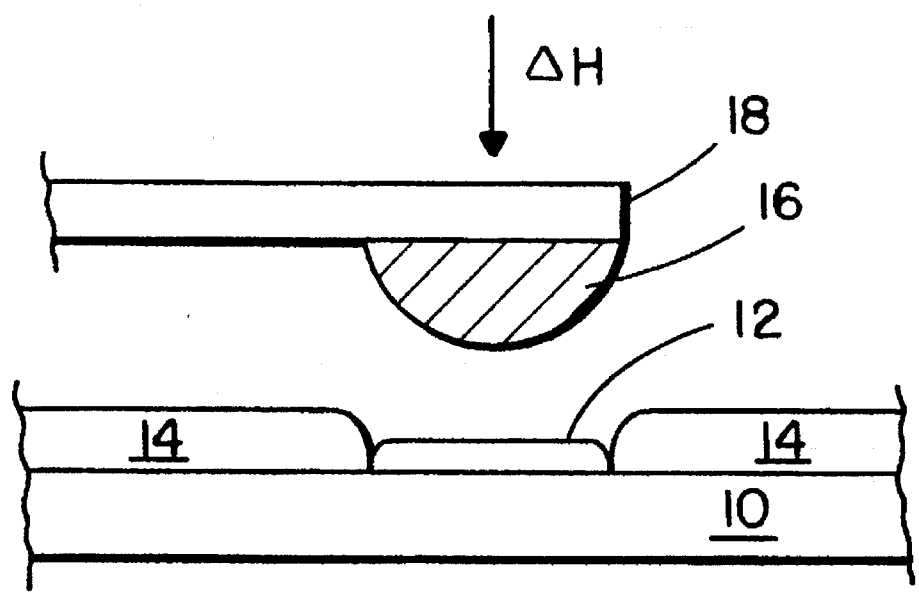
FIG. 2 is a section of the structure shown in FIG. 1 wherein the chemical solder has been preapplied to the lead rather than the land area on the chip.

In FIG. 2, a substantially identical structure is shown except that chemical solder deposit 16 has been preapplied to conductor 18 rather than the land area 12. When both heat and modest pressure are applied between conductor 18 and land area 12, a bonding occurs there between as soon as the decomposition polymer products have volatilized.

Application of the chemical solder can be accomplished by dispensing or by conventional printing techniques through a mask or a screen. Lithographic methods can also be used by the incorporation of a photosensitizer into the chemical solder. Acceptable photosensitizers are: thioxanthones, polyaromatic hydrocarbons (anthracenes), cationic or radical initiators, sulfonium salts or esters. The inclusion of a photosensitizer allows the blanket application of the chemical solder, followed by masking, exposure and development of the photoresist material to leave a desired pattern. Once the solvent is driven off, the material is stable and can be stored before further use.

EXAMPLE

A chemical solder has created interconnections between the lands of a semiconductor chip and the inner leads of a tape automated bonding (TAB) package by the following method—a one:one mixture of polyphthalaldehyde and DMF was blended with dimethyl gold acetylacetonate to give a 20% loading of the organometallic complex in the polymer. The resulting paste was then applied along 130 input/output pads of a semiconductor chip. The inner leads of a TAB frame were aligned over the pads of the semiconductor chip, placed in contact therewith and heated at 300° C. The resulting interconnects had average pull strengths of 80 grams, the highest pull strengths being observed at 121 grams. This is in contrast to typical TAB thermo-compression bond strengths of 70 grams and typical wire bond strengths of 12 grams.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

We claim:

1. A method for bonding a first to a second body comprising the steps of:

disposing between said first and second bodies a chemical solder including a compound which thermally degrades to a metal and volatile components within a predetermined temperature range having an upper temperature limit of 325° C. and a polymeric matrix which decomposes to volatile fractions within said same elevated temperature range; and heating said chemical solder within said predetermined elevated temperature range to thermally degrade said compound and to decompose said polymeric matrix, whereby a metal remains which bonds to said first and second bodies.

2. The method as recited in claim 1 wherein said polymeric matrix is selected from the class consisting of: polyphthalaldehyde, Poly (isopropenyl ketones), poly (alpha-methyl styrenes), poly (t-butyl carbonates), poly (alkene oxides), poly (alkene sulfides), alternating copolymers of phthalic anhydride with epoxides and poly (methacrylates).

3. The method as defined in claim 2 wherein said compound is selected from the class consisting of: copper acetylacetonate, cupric acetate, palladium acetylacetonate, platinum acetylacetonate, and dimethyl gold acetylacetonate.

4. The method as defined in claim 1 wherein said heating step occurs in the presence of a reducing gas.

5. The method as defined in claim 4 wherein said reducing gas is 3% to 10% $H_2$ in $N_2$.

* * * * *